United States Patent [19]

Lee

[11] Patent Number: 4,572,101

[45] Date of Patent: Feb. 25, 1986

[54] SIDE LIFTING WAFER BOAT ASSEMBLY

[75] Inventor: Steven N. Lee, Irvine, Calif.

[73] Assignee: ASQ Boats, Inc., Tustin, Calif.

[21] Appl. No.: 641,170

[22] Filed: Aug. 13, 1984

Related U.S. Application Data

[63] Continuation-in-part of Ser. No. 494,171, May 13, 1983, Pat. No. 4,515,104.

[51] Int. Cl.[4] .............................................. B05C 13/02
[52] U.S. Cl. ...................................... 118/500; 118/728; 211/41; 206/454; 206/328; 432/253
[58] Field of Search .................... 414/417; 294/15, 1.1; 118/500, 728, 729; 211/40, 41; 432/253, 261; 206/328, 454

[56] References Cited

U.S. PATENT DOCUMENTS

| 765,674 | 7/1904 | Normandin | 294/15 |
| 3,701,558 | 10/1972 | Baker | 294/15 X |
| 3,819,067 | 6/1974 | Hammond | 432/253 X |
| 3,861,733 | 1/1975 | Vander Mey | 206/328 X |
| 3,939,973 | 2/1976 | Wallestad | 206/328 |
| 4,256,229 | 3/1981 | Lee | 211/41 |
| 4,412,812 | 11/1983 | Sadowski et al. | 432/121 |
| 4,439,146 | 3/1984 | Sugita | 118/500 X |
| 4,477,114 | 10/1984 | Callis | 294/1 R |

FOREIGN PATENT DOCUMENTS 134553 10/1979 Japan ................................ 118/728

OTHER PUBLICATIONS

Meyers, "Detachable Handle Grip", IBM Tech. Disclosure Bulletin, vol. 19, No. 3, Aug. 1976, pp. 949-950.

Primary Examiner—Norman Morgenstern
Assistant Examiner—Bernard F. Plantz
Attorney, Agent, or Firm—Knobbe, Martens, Olson & Bear

[57] ABSTRACT

A side lifting wafer boat assembly is provided comprising a wafer supporting boat and boat lifting tool. The boat lifting tool is detachably engageable along the length of a boat. The tool is designed to permit sideway engagement with boats specifically designed for side lifting, or with boats that may also be end lifted, using a fork-like member which engages elongated pickup tubes.

15 Claims, 8 Drawing Figures

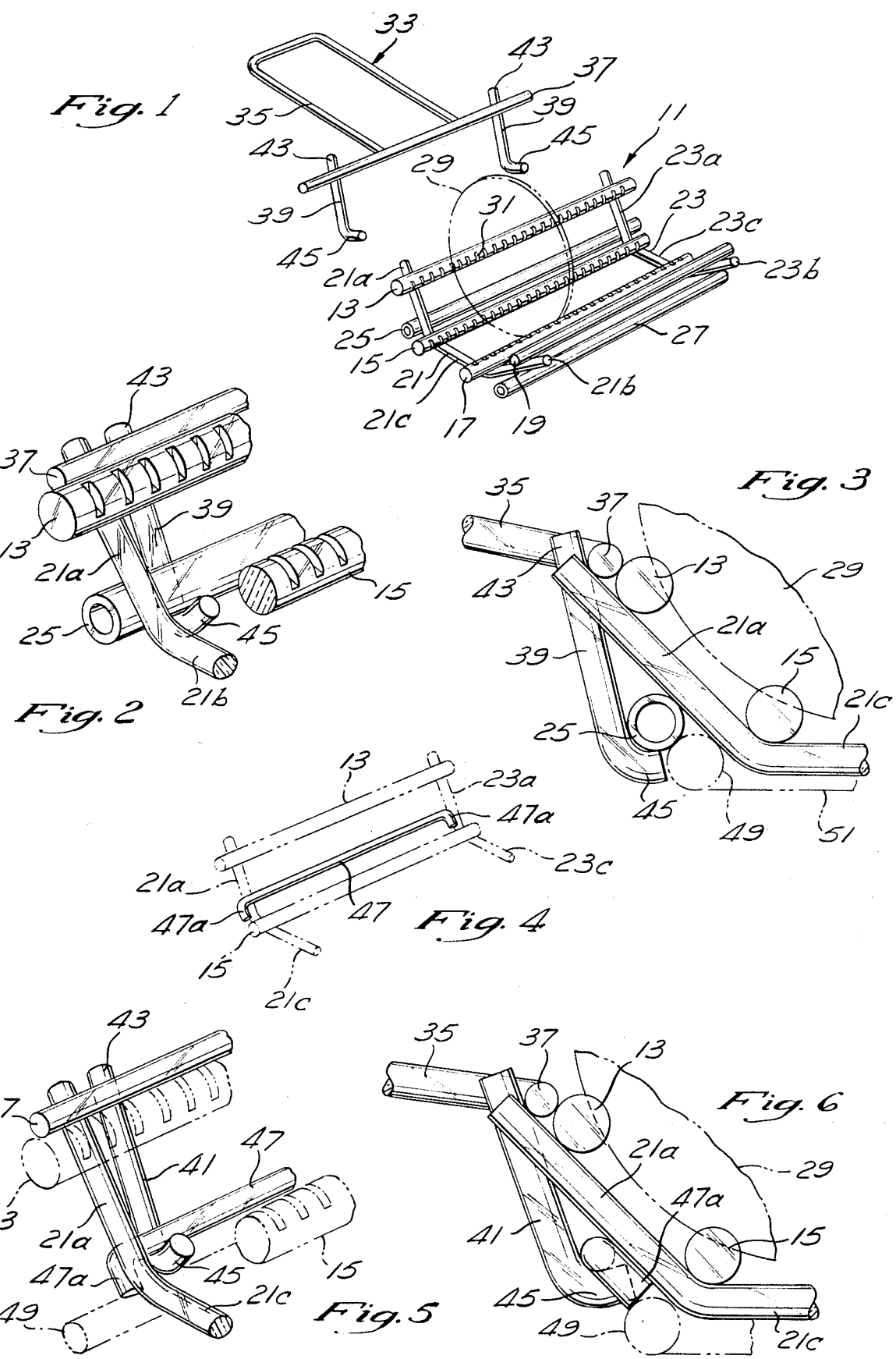

SIDE LIFTING WAFER BOAT ASSEMBLY

BACKGROUND OF THE INVENTION

This application is a continuation-in-part of a copending application, Ser. No. 494,171, now U.S. Pat. No. 4515104 filed May 13, 1983 for "Contiguous Wafer Boat", assigned to the common assignee.

This invention relates to the semi-conductor processing industry generally, and more particularly to an assembly for securing and transporting groups of semi-conductor wafers that are exposed to various treatment steps during the fabrication of semi-conductor devices.

In the fabrication of semi-conductor devices, e.g. transistors, it is common practice to simultaneously fabricate a plurality of semi-conductor components on a thin and fragile disk, typically 3–4 inches in diameter, known as a wafer. The wafer is typically composed of a semi-conductor material, such as monocrystalline silicon. Wafers of other materials may, however, also be utilized in the fabrication process, as for example, described in my patent Ser. No. 4,256,29, for "Boat For Wafer Processing". After fabrication the wafer is broken apart into individual components, or pellets, which are mounted in suitable enclosures.

The fabrication of the semi-conductor wafers commonly includes a variety of processing steps. Those steps include the placement of a group of wafers in a cassette or carrier, usually referred to as a "boat", and the placement of one or more boats onto an elongated sled or wheeled carrier which is moved into a high-temperature furnace for processing. The processing typically includes a variety of treatment steps, such as oxidation, diffusion, annealing, and low pressure chemical vapor deposition. When the high-temperature treatment is completed, the wafers are removed from the furnace and allowed to cool to room temperature. The wafers are then unloaded and sent to the next processing step.

During fabrication a number of layers are formed on the surface of the wafer which may then be selectively etched to form the desired conductive circuit. Careful control of the formation of those layers is necessary to insure the conductive quality of the resulting circuit. A wafer may, for example, undergo several steps of polycrystalline silicon deposition at elevated temperatures in a furnace. The polycrystalline silicon, commonly referred to as "poly", is deposited on the wafer by passing a gas including silene ($Si_4$) over the wafer.

Also in fabrication, an oxide layer will be formed on the silicon wafer prior to poly deposition and between other added layers of semi-conductor material. The oxide layers are typically non-conductive and act as an insulator between the substrate and the poly layer, or between two poly layers.

Holes are subsequently formed at selected areas through the oxide layer in order to permit electrical communication between semi-conductor layers. To form those holes the oxide layer is coated with a "photoresist" material. This photoresist material is responsive to light, and in particular to ultraviolet light. A photomask is prepared from the original design of the integrated circuit which comprises a photographic negative having light transparent and opaque regions tracing the desired circuit design. The mask is placed over the photoresist and the light is shown through the photomask to initiate the chemical change in the portions of the photoresist under the transparent regions of the photomask. It is then possible to wash away either the portions of the photoresist exposed to light or that not exposed to light. Whichever technique is employed, the elimination of the photoresist in certain regions permits direct exposure of the underlying oxide layer. The underlying oxide layer may then be etched in those regions by an etchant, such an acid. This provides exposure of the semi-conductor region beneath the oxide at selected regions on the surface of the integrated circuit. A conductive material may then be deposited on the surface, with the material flowing into electrical contact with the underlying semi-conductor region. Similar procedures can be used to form selected holes or gaps in the semi-conductor layer to form discrete "islands" of semi-conductor material. A sequence of steps will build the semi-conductor and oxide layers in interconnecting metal conductors to form the complete integrated circuit chip.

Formation of uniform and reliable conductive paths in the integrated circuit chip is therefore dependent upon close control of the fabrication steps that are performed while the wafer is supported on the boat in the furnace. The wafers are commonly supported edgewise in the boat in a generally spaced, parallel vertical, relation during the processing steps. Normally, the wafers are only contacted on their edges at spaced locations around the periphery of the edge. This maximizes the surface area of the wafer exposed during processing and supports the wafer in a manner to minimize gravitational stress on the wafer. Uniform parallel spacing is desirable so that each wafer is subject to uniform treatment during a processing step. The uniform spacing between wafers results in a higher yield of acceptable product because the gases that are conducted through the furnace during the processing operation may more readily flow past each of the wafers in generally the same manner. An even coating of predictable thickness may thus be applied to each wafer in the boat.

As previously mentioned, a carrier typically supports a plurality of boats, each boat containing a plurality of wafers. Different boats may hold wafers that are in different stages of processing and therefore it may be desirable to remove one boat from the carrier but not others. There may also be reasons to remove only certain boats from the carrier even when all wafers are in the same stage of processing, e.g., for inspection. It is therefore desirable to provide a boat lifting assembly that permits such selective removal of individual boats from the carrier.

Many prior art boats that have heretofore been employed utilize pickup tubes located across the ends of that boat which may be engaged by a fork-like member so as to lift the boat from the carrier. Those tubes are typically arranged along the width or length of the boat. A major disadvantage of disposing the pick-up tubes along the width of the boat is that such a construction results in wafer gaps between the ends of adjacent boats. Those gaps produce lack of uniformity of the gas flow past a series of boats filled with the wafers, resulting in a low yield of acceptable product. In addition, the gaps represent lost space within the furnace in that no wafers are being treated in the gaps filled by the pickup tubes.

The construction described in my co-pending application, Ser. No. 494,171, now U.S. Pat. No. 4,515,104 filed May 13, 1983, for "Contiguous Wafer Boat," discloses a construction wherein lengthwise pickup tubes are employed in such a manner that adjacent boats can be positioned in end-to-end relation with the wafer supporting slots continuing to the very ends of the boats. That construction allows the spacing between the end wafer of one boat and the end wafer of the next boat to be the same as the spacing between the rest of the adjacent wafers. Thus, the wafers are subjected to uniform gas treatment when a carrier, loaded with wafer boats, is positioned in a furnace. Though this construction provides advantages over prior art devices in that uniform gas treatment may be obtained, there are disadvantages in the lengthwise pickup technique. Principal of those disadvantages is that only the end boat of a plurality of boats disposed on a carrier may be picked up using the fork-like member. Thus, to remove a boat disposed in the middle of a carrier, each boat between the boat to be removed and the end of the carrier must also be removed. That requirement may be a substantial impediment to the fabrication process as described above, contributing to complexity and the loss of economy in the overall process.

Accordingly, a need exists for a wafer boat that is constructed to permit selective removal of any wafer boat in the carrier, without sacrificing uniform spacing between all wafers in the multiple boat assembly.

SUMMARY OF THE INVENTION

In accordance with the invention, a side lifting boat and tool assembly is provided which is detachably engageable to selectively lift a boat from the boat carrier. The boat and carrier are engageable such that the tool lifts against a weight supporting surface of the boat while impeding rotation of the boat about that surface, thereby stabilizing the boat during lifting. In the described embodiment this engagement is accomplished by providing an assembly wherein the tool and boat are brought to bear against each other at two contact points along the length of the boat, in a fulcrum-type arrangement.

The boat is provided with a first boat member extending along the length of the boat and a second boat member extending along the height of the boat. The tool is provided with a handle and a first boat engaging member adapted to bear against one of the boat members, such as a long side support rod, to form a lift contact joint. The tool also includes a second boat engaging member, adapted to bear against the other boat member, such as a cross piece, to impede rotation of the boat about the lift contact joint. In one construction, the lift joint is near the lower portion of the boat and the other joint is near the top. In an alternate approach, the locations are reversed.

Thus, the assembly is adapted to engage the boat and lifting tool without the necessity of fork receiving tubes or other connecting members disposed along the ends of the boat. Accordingly, side lifting may be effected without introducing gaps between adjacent boats. Uniform spacing may therefore be accomplished between all wafers.

The presently preferred tool may be adapted to accommodate end lifting boats having tubes running along the length thereof, or may be used in conjunction with boats that are specifically designed for side lifting arrangement, wherein solid rods may be used in place of tubes.

BRIEF DESCRIPTION OF THE DRAWINGS

FIG. 1 is a perspective view of one embodiment of the boat and tool assembly wherein the boat may also be end lifted.

FIG. 2 is an enlarged perspective view of a portion of the boat and tool assembly illustrated in FIG. 1.

FIG. 3 is an end elevational view of the structure illustrated in FIG. 2 showing the tool in engagement with the boat as mounted on a boat.

FIG. 4 is a perspective view of a portion of an alternate boat construction wherein the side tube is replaced by a rod having a curved end portion.

FIG. 5 is an enlarged perspective view of the joint formed between the tool and the boat construction illustrated in FIG. 4.

FIG. 6 is an end elevational view of the construction illustrated at FIG. 5.

DETAILED DESCRIPTION OF THE PREFERRED EMBODIMENT

Figure 7:
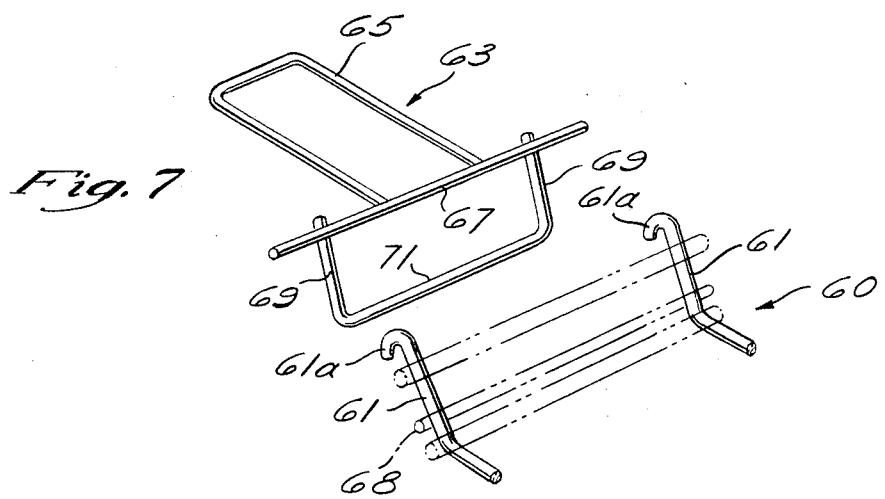
FIG. 7 is a perspective view of another version of the tool and boat.

Referring first to FIG. 1, the boat 11 shown therein includes a plurality of horizontal members, or side rails 13, 15, 17 and 19 disposed along the length of boat 11. The horizontal members are attached to cross members 21 and 23, which define a structure having a generally V-shaped cross section with angled side members extending along the height of the cross members and flat bottom portions. Cross members 21 and 23 include bottom portions 21c and 23c and side portions 21a, 21b, 23a and 23b. The side members 21a, 21b, 23a, and 23b extend along the height of boat 11.

The horizontal members 13, 15, 17 and 19 are disposed on the inside of cross members 21 and 23, and include a plurality of spaced slots 31 extending along the length of the horizontal members. The slots 31 are adapted to receive and support wafer disks 29 during fabrication in a high temperature furnace. Slots 31 may be formed of different shaped grooves, such as U-shaped grooves, Y-shaped grooves or V-shaped grooves to accommodate the particular application. Also, as further described in my previously issued U.S. Pat. No. 4,355,974, for "Wafer Boat," assigned to the common assignee, the slots along the length of boat 11 may be offset so as to support each wafer at a slight angle with respect to vertical, to reduce the play of the wafer within the groove and thereby increase wafer processing uniformity.

As shown in FIGS. 1, 2, and 3, boat 11 may be provided with horizontal tube members 25 and 27, disposed on the outside of cross members 21 and 23 and connected thereto. Tube members 25 and 27 may be sized to receive a fork shaped member that may be used for end lifting of boat 11. Alternatively, as described in more detail in connection with FIGS. 4, 5, and 6, tubes 25 and 27 may be replaced by horizontal rod members that will accommodate side lifting but will not accommodate a fork shaped end lifting tool.

Tool 33 is adapted for attachable engagement with boat 11 for side lifting of boat 11. Tool 33 includes handle portion 35 which is connected to horizontal boat engaging member 37. Vertically extending boat engaging members or tines 39 are connected to horizontal member 37 and extend generally downwardly therefrom to be inserted into engagement with the boat. Tines 39 are typically spaced approximately 4–6 inches apart and extend downwardly from the handle 35 at an angle of approximately 75° from the plane of the handle 35. Tines 39 include curved end portions 45 giving the tines somewhat of a J-shaped. these end portions are curved to engage horizontal tube member 25 of boat 11 to form a lift joint to bear the weight of boat 11 when lifted by tool 33 from its normal resting position. The lift joint between member 39 and tube 25 is shown more clearly in connection with FIGS. 2 and 3.

To facilitate secure engagement of tool 33 to boat 11, horizontal member 37 is disposed adjacent members 21a and 23a, extending along the height of boat 11. In the presently preferred embodiment tool handle 35 forms a slight upward angle, of approximately 10°, from horizontal member 37 when tool 33 is normally engaged to boat 11, i.e., when boat 11 is resting on a supporting surface. Upon lifting, handle 35 is moved to a more horizontal position causing slight rotation about the lifting joint formed between member 45 and tube 25. That action causes horizontal member 37 to rigidly bear against members 21a and 23a to impede rotation of boat 11 about that joint, i.e., the rotation limiting joint.

The lift joint formed between members 45 and tube 25, in conjunction with the action of member 37 abutting against members 21a and 23a, effects a fulcrum type of engagement between the boat 11 and tool 33. That is, the member 45 is disposed about the tube 25 which in turn bears against the outside of members 21a and 23a, while member 37 abuts the inside of members 21a and 23a. Thus, the boat is firmly engaged to the tool 33.

Depending upon the relative size and precise placement of tube 25 in relation to cross members 21, 23 and horizontal members 13, 15, the length of the curved portions 45 may be sufficient to extend around the bottom of tube 25, or may end at the bottom of tube 25. The particular choice should be such as to provide sufficient lifting surface without causing contact between portion 45 and the wafer 29, and without interfering with the seating of boat 11, e.g., in the carrier. FIG. 3 illustrates boat 11 resting on rod 49 (dashed lines) which forms a supporting surface of a boat carrier 51 (dashed lines) which stabilizes boat 11 within the carrier. That is, the tubes 25 and 27 limit transverse movement of the boat and the carrier 51. In relative geometries shown in FIG. 3, the length of end portion 45 extends only slightly past the lowest portion of tube 25. In view of the fulcrum type engagement of tool 33 to boat 11, it is typically unnecessary for portion 45 to extend any further beyond the lower portion of tube 25.

Tube 25 may be replaced by a solid rod, such as horizontal rod member 47, shown in FIG. 4. Rod 47 may be of smaller diameter than that of tube 25 and less costly to produce. Because of the smaller diameter, the rod 47 cannot be positioned so as to engage the rod 49, because the rod 49 would interfere with the insert of the tool portion 45. In order to provide more room for engagement of portions 45 to boat 11, horizontal rod member 47 may be provided with at least one curved end portion 47a, shown at FIGS. 4, 5, and 6, to abut horizontal carrier rod 49, and thereby space the length portion of horizontal rod 47 from the length portion of horizontal member 49. The added space between members 47 and 49 provides further space to permit engagement of horizontal member 47 by tool curved portion 45. The remaining portions of boat 11 and tool 33 may remain as previously described in connection with FIGS. 1, 2 and 3. The rod end portion 47a engages carrier rod 49 to limit lateral movement of the boat on the carrier.

It should also be understood that members 39 may be spaced apart any convenient length to engage tube 25, or rod 47. It is desirable, however, that the spacing be such that the tool 33 and tines 39 fit easily between the cross pieces 21 and 23, while the cross pieces limit movement of the tool along the boat.

A fulcrum type side lifting engagement similar to that described above may be effected by alternative constructions. In one such arrangement, the tool and the boat may be constructed so that the lifting joint and the rotation limiting joints are reversed. That is the lifting joint can be the upper joint and the lower joint can be the rotation limiting joint.

Figure 8:
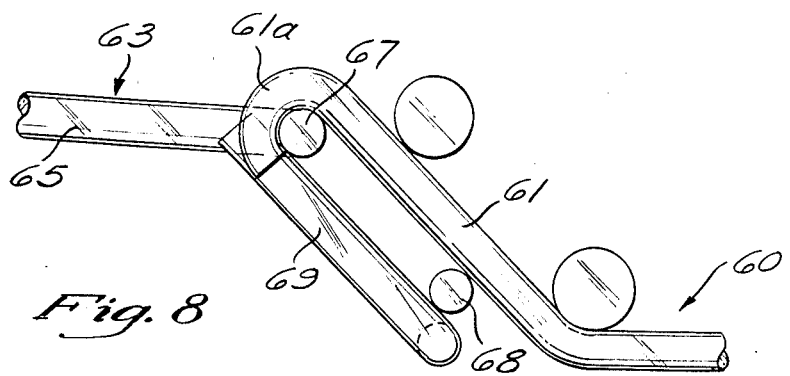
FIG. 8 is an end elevational view of the construction of FIG. 7.

Such an arrangement is shown in FIGS. 7 and 8, wherein a boat 60 is provided with cross pieces 61 each having a downwardly opening hook 61a on its upper end. A tool 63 includes a U-shaped handle 65 joined at its open end to a rod 67 extending generally transverse or perpendicular to the handle. The length of the rod is a little longer than the distance between the boat cross pieces 61 so that both hooks 61a can be engaged by the rod 67 but yet an adjacent boat cannot be engaged when the tool is centered on one boat.

The tool 63 is further formed with two tines or arms 69 that angle downwardly similar to the tool of FIG. 1. The tines are spaced to fit within the space between the cross piece 61 with the tines close to the cross pieces so that the tool is laterally positioned by the cross pieces.

The tines 69 are long enough such that their lower ends engage a boat support rod 68 when the rod 67 fits under the hooks 61a. To provide adequate strength, the ends of the tines 69 are joined by another rod 71, such that a rectangular frame is formed on the tool by the tines and the connecting rods.

In use, the tool is moved laterally towards the side of a boat, and the ends of the rod 67 fit into the hooks 61a, while the tines 69 fit between the cross pieces 61. The rod ends and the hooks thus form upper lift joints for the assembly,, as seen in FIG. 8. Rotating the handle downwardly about the hooks causes the tines 69 to engage the boat support rod 68 to form a joint that limits rotation of the tool. The assembly can then be lifted upwardly by the handle. The lifting force against the hooks causes the load to want to pivot about the upper lift joint, but the lower joint prevents such rotation.

What is claimed is:

1. A side lifting wafer boat assembly adapted for detachable, mutual engagement along the length of a boat to lift the boat from a boat supporting surface, said assembly comprising:

a boat shaped to receive a plurality of wafer disks, disposed in spaced parallel relation perpendicular to the length of said boat, a first boat member extending along the length of said boat, and a second boat member extending along at least a portion of the height of said boat; and a tool adapted for detachable lateral engagement to said boat along the length thereof, said tool comprising a handle projecting externally from the side of the boat upon engagement of tool to the boat, a first boat engaging member adapted to bear against one of said boat members to form a lift contact joint to support the weight of said boat, and a second boat engaging member adapted to be locatable to bear against the other of said boat members to form a rotation contact joint to impede rotation of said boat about said lift contact joint.

2. The assembly as recited in claim 1 wherein said first boat engaging member includes curved end portions adapted to engage and support said first boat member.

3. The assembly as recited in claim 1 wherein said first boat member is a tube.

4. The assembly as recited in claim 1, wherein said boat includes a boat supporting member to stabilize said boat, and said first boat member is a rod, said rod having at least one curved end portion adapted to abut against said boat supporting member, said end portion further being adapted to space the length of said first boat member from the boat supporting surface thereby facilitating engagement of said first boat member and said first boat engaging member.

5. The assembly as recited in claim 1, wherein said left contact joint and said rotation contact joint are disposed between lengthwise ends of said boat.

6. The assembly as recited in claim 1, wherein said tool further comprises a rod connected to said handle and disposed generally parallel to the length of said boat upon engagement to said tool, a pair of generally J-shaped tines connected to said rod at spaced locations along the length of said rod and extending generally vertically therefrom, said tines having curved lower end portions each being engageable with said first boat member to form one of said lift contact joints, said rod having end portions extending beyond the connections to said tines, each of said rod end portions being engageable with said second boat member to form a rotation contact joint.

7. The assembly as recited in claim 1, wherein one of said boat members is formed with slots adapted to receive said wafer disks.

8. The assembly recited in claim 7, wherein said slots are uniformly spaced and extend to the length of said boat so a plurality of boats may be disposed lengthwise along a boat carrier, with the space between proximate slots on adjacent boats being equal to the space between adjacent slots in each boat.

9. The assembly as recited in claim 1 wherein said first boat engaging member is adapted to slightly rotate about said first lift joint as the tool is inserted into the boat and the boat is lifted.

10. A side lifting wafer boat assembly adapted for detachable mutual engagement to lift a boat from a boat supporting surface, said assembly comprising:
a boat comprising at least one cross member, each of said cross members comprising a plurality of upward extending side members joined by a base member, and a plurality of horizontal members connected to said cross members and extending transverse thereto; and
a boat engaging tool adapted for lateral engagement to said boat along the length thereof, said tool comprising a handle projecting laterally to the length of said boat upon engagement of said tool to said boat, a first boat engaging member adapted to bear against at least one of said boat horizontal members to form a lift contact joint, and a second boat engaging member adapted to bear against at least one of said side members to form a rotation contact joint to impede rotation of said boat about said lift contact joint.

11. The assembly as recited in claim 10 wherein said first boat engaging member is adapted to slightly rotate about at least one of said boat horizontal members as said handle is moved towards a horizontal position.

12. The assembly as recited in claim 10 wherein said lift contact joint and said rotation contact joint are disposed along the length of said boat between said cross members.

13. A side lifting wafer boat assembly adapted for detachable mutual engagement along the length of a boat to lift the boat from a boat supporting surface, said assembly comprising:
a boat comprising a plurality of cross members, each of said cross members comprising a plurality of upwardly extending side members joined by a base member, a plurality of horizontal wafer supporting members extending lengthwise between said cross members, each of said wafer supporting members having a plurality of wafer receiving slots disposed in spaced parallel relation and at least one horizontal tool engaging rod connected to an outside surface of a pair of lengthwise opposite side members; and
a tool adapted for lateral engagement to said boat along the lengths thereof, said tool comprising a handle projecting perpendicular to said boat horizontal members upon engagement of said boat with said tool, a tool rod connected to said handle and disposed generally parallel to said boat horizontal members upon engagement of said boat to said tool, a pair of tines connected to said tool rod at spaced locations along the length of said tool rod and extending generally vertically therefrom, said tines having curved, generally J-shaped lower end portions engageable with first boat horizontal member, said tool rod further including end portions beyond the connections to said tines, each of said tool rod end portions being engageable with an inside surface of one of said boat side members.

14. A side lifting wafer boat assembly adapted for detachable, mutual engagement along the length of a boat to lift the boat from a boat supporting surface, said assembly comprising:
a boat shaped to receive a plurality of wafer disks disposed in spaced parallel relation perpendicular to the length of said boat, first and second boat members forming a portion of a frame of said boat, said boat members being disposed along the length of said boat; and
a tool adapted for detachable lateral engagement to said boat along the length thereof, said tool comprising a handle projecting perpendicular to the length of said boat upon engagement of said boat to said tool, a first boat engaging member adapted to bear against one of said boat members to form a lift contact joint to support the weight of said boat, and a second boat engaging member adapted to be locatable to bear against the other of said boat members to form a rotation contact joint to impede rotation of said boat about said lift contact joint.

15. A side lifting wafer boat assembly comprising:
a boat having a plurality of long elements for receiving a group of wafers in spaced relation, the elements being joined by a pair of spaced cross pieces positioned on the lower side of the elements, an upper end of each cross piece being formed with a downwardly opening hook; and
a tool comprising a handle, a rod attached to the handle sized to fit within said hooks to form a lifting joint, and means attached to the rod to engage one of said boat elements and form a joint for limiting rotation of the boat when the boat is lifted by said tool.

* * * * *